(12) United States Patent
Tsao et al.

(10) Patent No.: US 12,131,993 B2
(45) Date of Patent: Oct. 29, 2024

(54) INTERCONNECT STRUCTURE

(71) Applicant: United Microelectronics Corp., Hsinchu (TW)

(72) Inventors: To-Wen Tsao, Tainan (TW); Ching-Chang Hsu, Tainan (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 18/191,894

(22) Filed: Mar. 29, 2023

(65) Prior Publication Data
US 2023/0238321 A1  Jul. 27, 2023

Related U.S. Application Data

(62) Division of application No. 17/166,577, filed on Feb. 3, 2021, now abandoned.

(30) Foreign Application Priority Data

Jan. 14, 2021 (CN) .......................... 202110047135.3

(51) Int. Cl.
   *H01L 23/528* (2006.01)
   *H01L 23/522* (2006.01)

(52) U.S. Cl.
   CPC ........ *H01L 23/528* (2013.01); *H01L 23/5221* (2013.01)

(58) Field of Classification Search
   CPC ............... H01L 23/528; H01L 23/5221; H01L 27/0207; H01L 21/7684; H01L 23/5283; H01L 23/481; H01L 21/76; H01L 21/768
   See application file for complete search history.

(56) References Cited

U.S. PATENT DOCUMENTS

| | | | |
|---|---|---|---|
| 5,441,598 A * | 8/1995 | Yu | B24B 37/26 438/692 |
| 5,602,423 A * | 2/1997 | Jain | H01L 21/7684 257/E21.583 |
| 6,165,886 A | 12/2000 | Lin et al. | |
| 6,403,389 B1 | 6/2002 | Chang et al. | |
| 6,858,944 B2 | 2/2005 | Huang et al. | |
| 6,940,108 B2 | 9/2005 | Cheng et al. | |
| 7,089,522 B2 | 8/2006 | Tan et al. | |
| 7,365,413 B1 * | 4/2008 | Kretchmer | H01L 23/5286 257/776 |
| 7,387,950 B1 | 6/2008 | Kuo et al. | |
| 7,741,715 B2 | 6/2010 | Kim et al. | |
| 8,901,003 B1 | 12/2014 | Pan et al. | |
| 8,921,226 B2 | 12/2014 | Hung et al. | |
| 9,012,300 B2 | 4/2015 | Sie et al. | |
| 9,040,315 B2 | 5/2015 | Wu et al. | |
| 9,093,465 B2 | 7/2015 | Li et al. | |

(Continued)

*Primary Examiner* — Galina G Yushina
(74) *Attorney, Agent, or Firm* — JCIPRNET

(57) ABSTRACT

An interconnect structure is formed on a substrate in a semiconductor device. The interconnect structure includes a dielectric layer and a metal layer. The dielectric layer includes a region and a plurality of protrusions. The metal layer is disposed on the region and between the protrusions, wherein tops of the protrusions are exposed with respect to the metal layer. In a top view of the semiconductor device, the protrusions are distributed in the region. Any straight path crossing through a central region of the region is always intersected with a portion of the protrusions.

6 Claims, 9 Drawing Sheets

(56) References Cited

U.S. PATENT DOCUMENTS

| | | | |
|---|---|---|---|
| 9,230,912 B2 | 1/2016 | Hsu et al. | |
| 9,318,378 B2 | 4/2016 | Lim et al. | |
| 9,583,594 B2 | 2/2017 | Liao et al. | |
| 9,873,994 B2 | 1/2018 | Wagner et al. | |
| 10,062,943 B2 | 8/2018 | Li | |
| 10,153,231 B2 | 12/2018 | Lin et al. | |
| 2002/0043715 A1* | 4/2002 | Takizawa | H01L 23/528 257/E21.244 |
| 2004/0266326 A1* | 12/2004 | Shiho | B24B 37/26 451/526 |
| 2005/0127496 A1* | 6/2005 | Kwon | H01L 24/05 438/622 |
| 2006/0220250 A1* | 10/2006 | Kim | H01L 23/562 257/E23.002 |

* cited by examiner

INTERCONNECT STRUCTURE

CROSS-REFERENCE TO RELATED APPLICATION

This application is a divisional application of and claims the priority benefit of U.S. patent application Ser. No. 17/166,577, filed on Feb. 3, 2021. The prior application Ser. No. 17/166,577 claims the priority benefit of Chinese patent application serial no. 202110047135.3, filed on Jan. 14, 2021. The entirety of each of the above-mentioned patent applications is hereby incorporated by reference herein and made a part of this specification.

BACKGROUND OF THE INVENTION

Field of the Invention

The invention relates to a semiconductor manufacturing technique, and particularly to an interconnect structure in a semiconductor device.

Description of Related Art

Semiconductor devices all include interconnect structures for connecting related devices in an integrated circuit to complete the desired circuit architecture.

As generally known, the desired circuit architecture may be manufactured into a semiconductor device structure using a semiconductor manufacturing technique to achieve integrated circuit manufacture. For example, the structure of a conductor device may include a plurality of transistor elements. These transistors need to be connected to other devices using interconnect structures.

In other words, after a variety of devices are manufactured on the substrate, they require interconnect structures to provide electrical connections between the devices. For example, there are regions with high device density and regions with low device density on the substrate. The linewidth of the interconnect structures in the low device density regions is greater. The linewidth of the interconnect structures in the high device density regions is relatively less.

The material of the interconnect structures is generally a copper material, for example. In manufacture, a patterned dielectric layer is generally formed first, which is also generally referred to as an inter-layer dielectric layer. The pattern of the dielectric layer provides a recessed pattern for forming the interconnect structures. Next, the copper material covers the pattern of the dielectric layer, and then a polishing process is used to remove the copper material on the dielectric layer, stopping at the dielectric layer. The remaining copper material is filled in the recessed pattern of the dielectric layer to complete the manufacture of the interconnect structures.

When the polishing process is performed on the substrate, the polishing pressure sustained by the copper material in the high device density regions and the low device density regions is different according to the density of the recessed pattern of the dielectric layer. The copper in the low device density regions has a greater linewidth, thus readily causing dishing, and therefore reducing the quality of the interconnect structures.

For the manufacture of interconnect structures, a technique of reducing dishing phenomenon in low device density regions or large linewidth regions still needs further research and development.

SUMMARY OF THE INVENTION

The invention provides a manufacture of an interconnect structure, wherein, for example, dishing phenomenon to an interconnect in a low device density region or a large linewidth region may be effectively reduced to maintain the design thickness of the interconnect.

In an embodiment, the invention provides an interconnect structure formed on a substrate in a semiconductor device. The interconnect structure includes a dielectric layer disposed over the substrate and metal layer, wherein the dielectric layer includes a region and a plurality of protrusions, and the plurality of protrusions are distributed in the region. The metal layer is disposed on the region and between the plurality of protrusions, wherein tops of the plurality of protrusions are exposed with respect to the metal layer. Any straight path crossing through a central region of the region is always intersected with a portion of the plurality of protrusions.

In an embodiment, regarding the interconnect structure, in the top view of the semiconductor device, the plurality of protrusions include: a plurality of bent strips extended in a direction, wherein a bent shape of each of the bent strips is a pulse signal shape; a plurality of straight bars extended in the direction and arranged with the plurality of bent strips alternately. Extension bars are at a left side and a right side of each of the straight bars, perpendicular to the direction, and alternately arranged corresponding to a concave folding region of each of the bent strips.

In an embodiment, regarding the interconnect structure, the region consists of rows of sub-regions extending in the direction and directly contiguous with each other, each row comprises one of the bent strips and one of the straight bars.

In an embodiment, regarding the interconnect structure, each of the bent strips is in direct contact with an edge of the row in which the bent strip is disposed.

In an embodiment, regarding the interconnect structure, the plurality of extension bars at one of the left side and the right side are in direct contact with an edge of the row in which the straight bar is disposed.

In an embodiment, regarding the interconnect structure, the plurality of extension bars at the left side of the straight bars are aligned with each other in another direction perpendicular to the direction.

In an embodiment, regarding the interconnect structure, the plurality of extension bars at the right side of the straight bars are aligned with each other in another direction perpendicular to the direction.

In an embodiment, the invention further provides an interconnect structure formed on a substrate in a semiconductor device. The interconnect structure includes a metal layer disposed on a substrate. The metal layer has a region and a plurality of slots, and in a top view of the semiconductor device, the plurality of slots are distributed in the region. Any straight path crossing through a central region of the region is always intersected with a portion of the plurality of slots.

In an embodiment, regarding the interconnect structure, in the top view of the semiconductor device, the plurality of slots include: a plurality of bent slots extended in a direction, wherein a bent shape of each of the bent slots is a pulse signal shape; a plurality of straight slots extended in the direction and arranged with the plurality of bent slots alternately; and a plurality of extension bars at a left side and a right side of each of the straight slots, perpendicular to the direction, and alternately arranged corresponding to a concave folding region of each of the bent slots.

In an embodiment, regarding the interconnect structure, the region consists of rows of sub-regions extending in the direction and directly contiguous with each other, each row comprises one of the bent slots and one of the straight slots.

In an embodiment, regarding the interconnect structure, each of the bent slots is in direct contact with an edge of the row in which the bent slot is disposed.

In an embodiment, regarding the interconnect structure, the plurality of extension bars at one of the left side and the right side are in direct contact with an edge of the row in which the straight slot is disposed.

In an embodiment, regarding the interconnect structure, the plurality of extension bars at the left side of the straight slots are aligned with each other in another direction perpendicular to the direction.

In an embodiment, regarding the interconnect structure, the plurality of extension bars at the right side of the straight slots are aligned with each other in another direction perpendicular to the direction.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention relates to an interconnect structure including a region belonging to, for example, a low device density region or a large linewidth region. In this region, the manufacturing process of the interconnect structure eliminates a dishing path using the protrusions of the dielectric layer, so as to reduce dishing of the interconnect structure caused by a metal polishing process.

A plurality of embodiments are provided below to illustrate the invention, but the invention is not limited to the plurality of embodiments provided. The plurality of embodiments may also be combined with each other.

Before proposing the interconnect structure, the invention first looks into the manufacturing process of the interconnect structure to facilitate understanding of the mechanism of the dishing path that may occur in the portion of the interconnect structure belonging to, for example, a low device density region or a large linewidth region. Thereafter, the invention proposes to effectively eliminate the dishing phenomenon of the interconnect structure.

Figure 1:
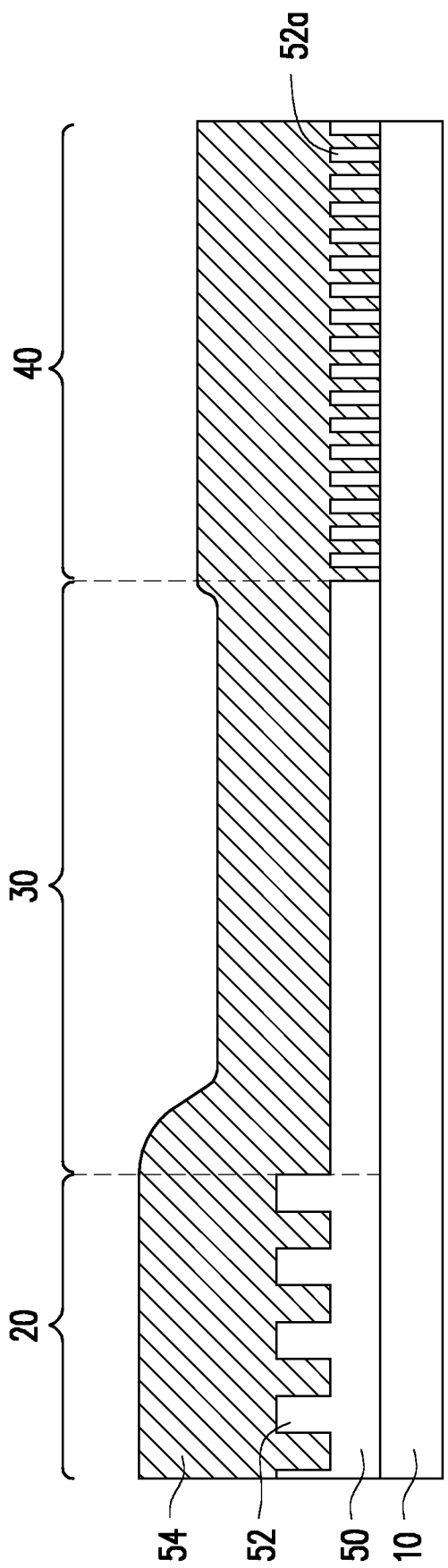
FIG. 1 is a schematic diagram of a cross-sectional structure of an interconnect structure before polishing according to an embodiment.

The following first describes the dishing situation of the interconnect structure explored in the invention. FIG. 1 is a schematic diagram of a cross-sectional structure of an interconnect structure before polishing according to an embodiment.

Referring to FIG. 1, during the manufacturing process of the interconnect structure, a dielectric layer 50 is formed on a substrate 10. In a broad sense, the substrate 10 may include a basic structure on which devices are already formed, and an interconnect structure is formed on the substrate 10 to connect the devices. Based on a semiconductor manufacturing technique, a patterned dielectric layer is formed on the substrate 10 to complete the interconnect structure later. Compared with the metal layer of the interconnect structure, the dielectric layer 50 may also be regarded as the upper structure of the substrate 10. The following description starts with the dielectric layer 50, and the invention is not limited to other elements that may already be formed in the substrate, such as including already formed transistors and inter-layer dielectric layers and the like.

The dielectric layer 50 matches the interconnect structure to be formed, and includes some patterns 52 and 52a. The patterns 52 correspond to the interconnect structure in the high device density region. The dielectric layer 50 also includes a region 30 with a large metal linewidth and a region 40 with a large metal linewidth including vias. The patterns 52a of the dielectric layer 50 are provided for forming via structures. Next, a metal layer 54 for forming an interconnect structure is formed on the dielectric layer 50. The metal layer 54 also completely fills the recessed structure provided by the patterns 52 and 52a on the dielectric layer 50.

Figure 2:
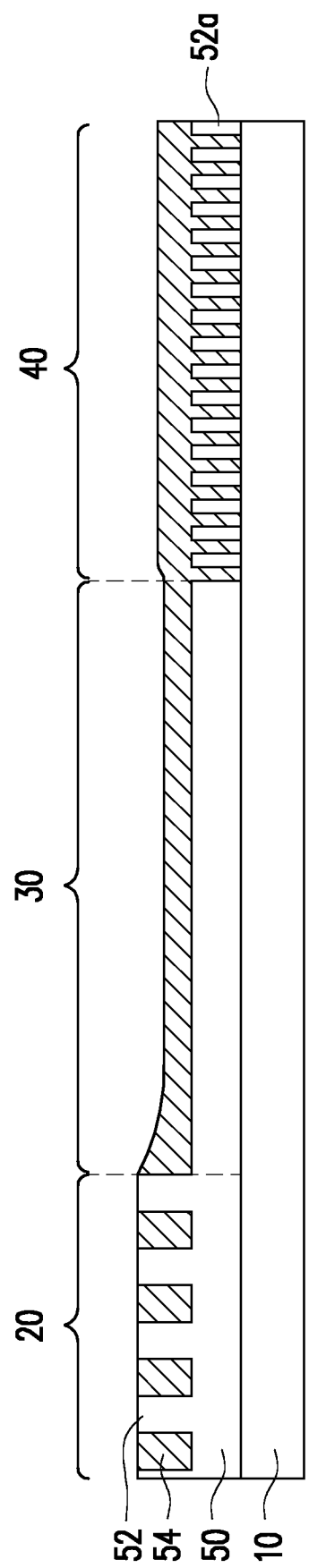
FIG. 2 is a schematic diagram of a cross-sectional structure of a studied interconnect structure after polishing according to an embodiment.

FIG. 2 is a schematic diagram of a cross-sectional structure of a studied interconnect structure after polishing according to an embodiment. Referring to FIG. 2, the polishing process polishes the metal layer 54 using a polishing pad. The polishing process stops on the dielectric layer 50. The remaining metal layer 54 forms an interconnect structure on the dielectric layer 50.

As observed, the metal layer 54 is dished in the region 30 and the region 40, thus affecting the quality of the interconnect structure. The reason why the metal layer 54 is dished in the region 30 and the region 40 is due to the lack of a dielectric layer structure that may resist the polishing pressure in the region 30 and the region 40 with respect to the region 20.

Figure 3:
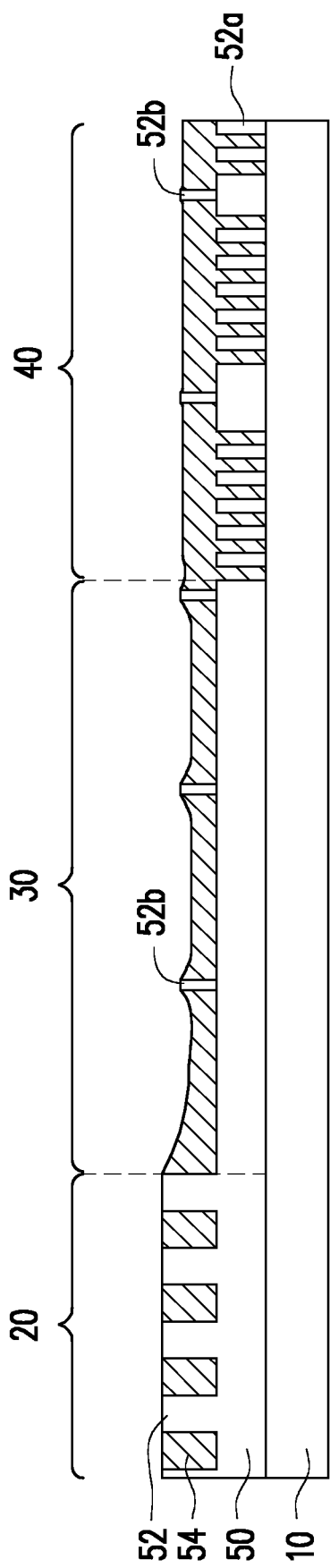
FIG. 3 is a schematic diagram of a cross-sectional structure of a studied interconnect structure after polishing according to an embodiment.

FIG. 3 is a schematic diagram of a cross-sectional structure of a studied interconnect structure after polishing according to an embodiment. Referring to FIG. 3, to reduce the dishing of the metal layer 54 in the region 30 and the region 40, protrusions 52b may be additionally formed on the dielectric layer 50 to reduce dishing. However, difference in the size and number of the protrusions 52b also produces different degrees of dishing.

Figure 4:
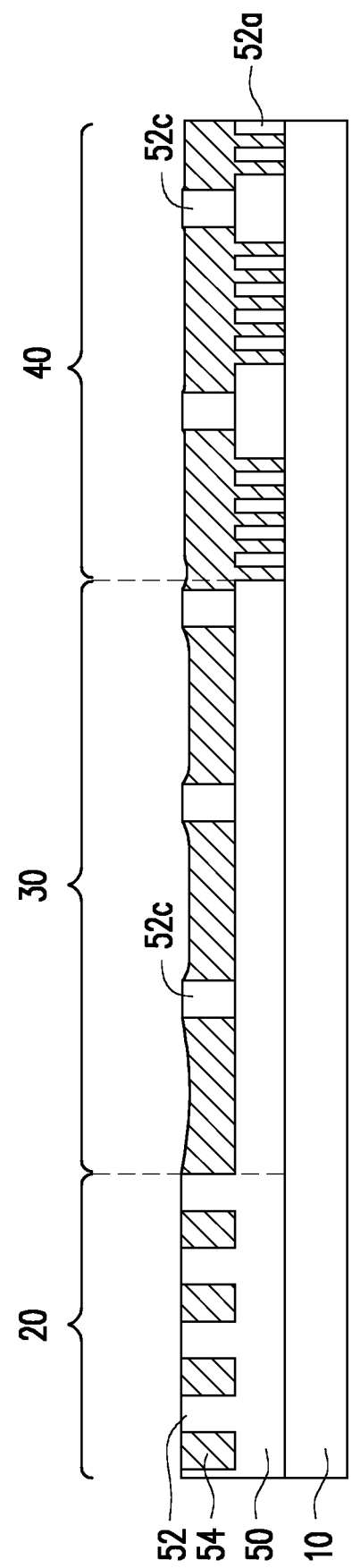
FIG. 4 is a schematic diagram of a cross-sectional structure of a studied interconnect structure after polishing according to an embodiment.

FIG. 4 is a schematic diagram of a cross-sectional structure of a studied interconnect structure after polishing according to an embodiment. Referring to FIG. 4, protrusions 52c are additionally formed on the dielectric layer 50, that are wider than the protrusions 52b of FIG. 3, and may more effectively reduce the degree of dishing.

Figure 5:
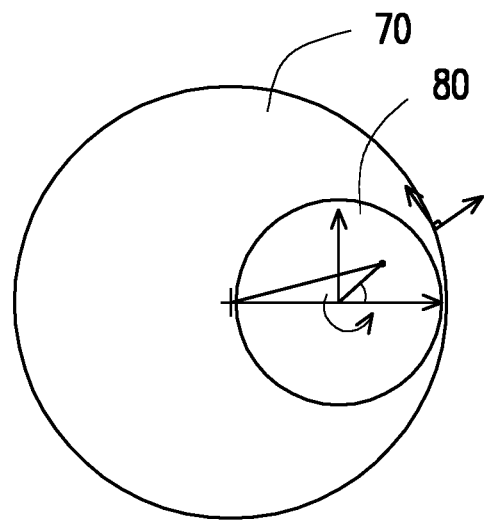
FIG. 5 is a schematic diagram of the polishing action of a polishing process according to an embodiment.

FIG. 5 is a schematic diagram of the polishing action of a polishing process according to an embodiment. Referring to FIG. 5, before the cause of dishing may be found and an improved technique is proposed, the mechanism of the polishing process is explained first. When the structure on a substrate 80 is to be polished, the structure surface of the substrate 80 in wafer state is in contact with a polishing pad 70. The substrate 80 and the polishing pad 70 are each rotated according to the rotation axis thereof. The contact surface between the polishing pad 70 and the substrate 80 bears the polishing effect in every direction of 360 degrees.

Figure 6:
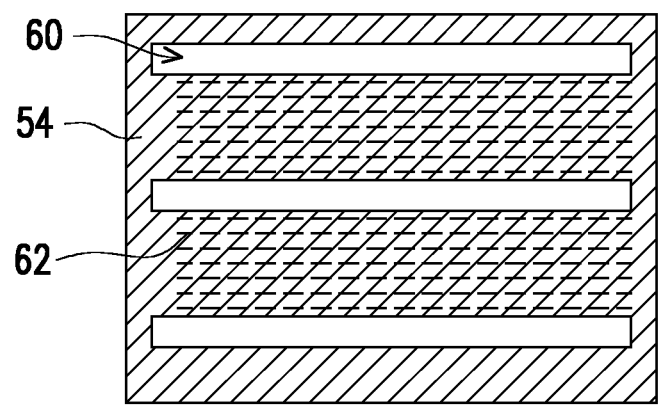
FIG. 6 to FIG. 8 are schematic diagrams of planar structures in which the interconnect structure is dished during the polishing process according to a plurality of embodiments.
Figure 7:
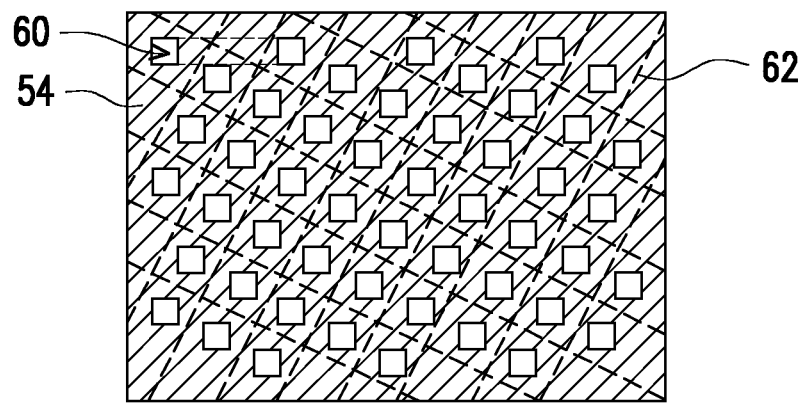
Figure 8:
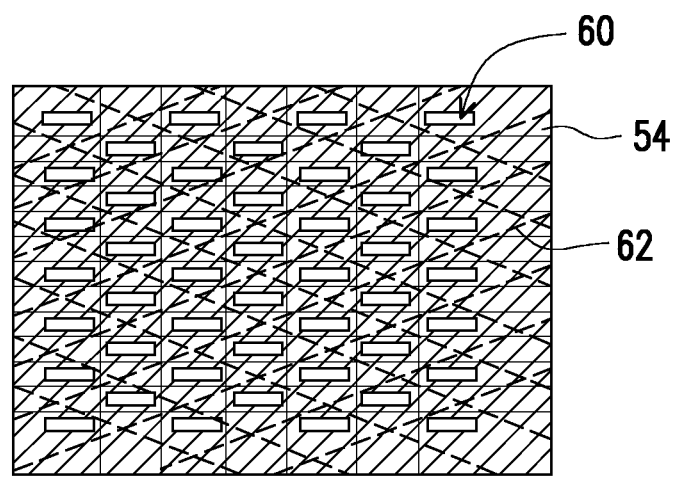

FIG. 6 to FIG. 8 are schematic diagrams of planar structures in which the studied interconnect structure is dished during the polishing process according to a plurality of embodiments.

Referring to FIG. 6, with the protrusions 52*b* and 52*c* of FIG. 3 or FIG. 4, the structure from the plan view may be adjusted to, for example, protrusions 60 having the shape of a long straight bar. The polishing process is 360-degree polishing, and although the straight bar-shaped protrusions 60 may resist polishing in most directions, for example, there are no protrusions 60 in the direction parallel to the protrusions 60 to block the polishing path. As a result, the metal material in this direction is readily polished, thus forming a dishing path 62.

Referring to FIG. 7, if the straight bar-shaped protrusions 60 are modified into a plurality of scattered small square protrusions 60, a possible dishing path 62 may still be present.

Referring to FIG. 8, combining the effects of FIG. 6 and FIG. 7, the protrusions 60 are modified to a plurality of short straight bars, and some potential dishing paths 62 are still present.

The invention further improves the design of the protrusions 60, so that there are protrusions blocking in all 360 degrees of the polishing path, so as to eliminate the forming of the dishing path.

Figure 9:
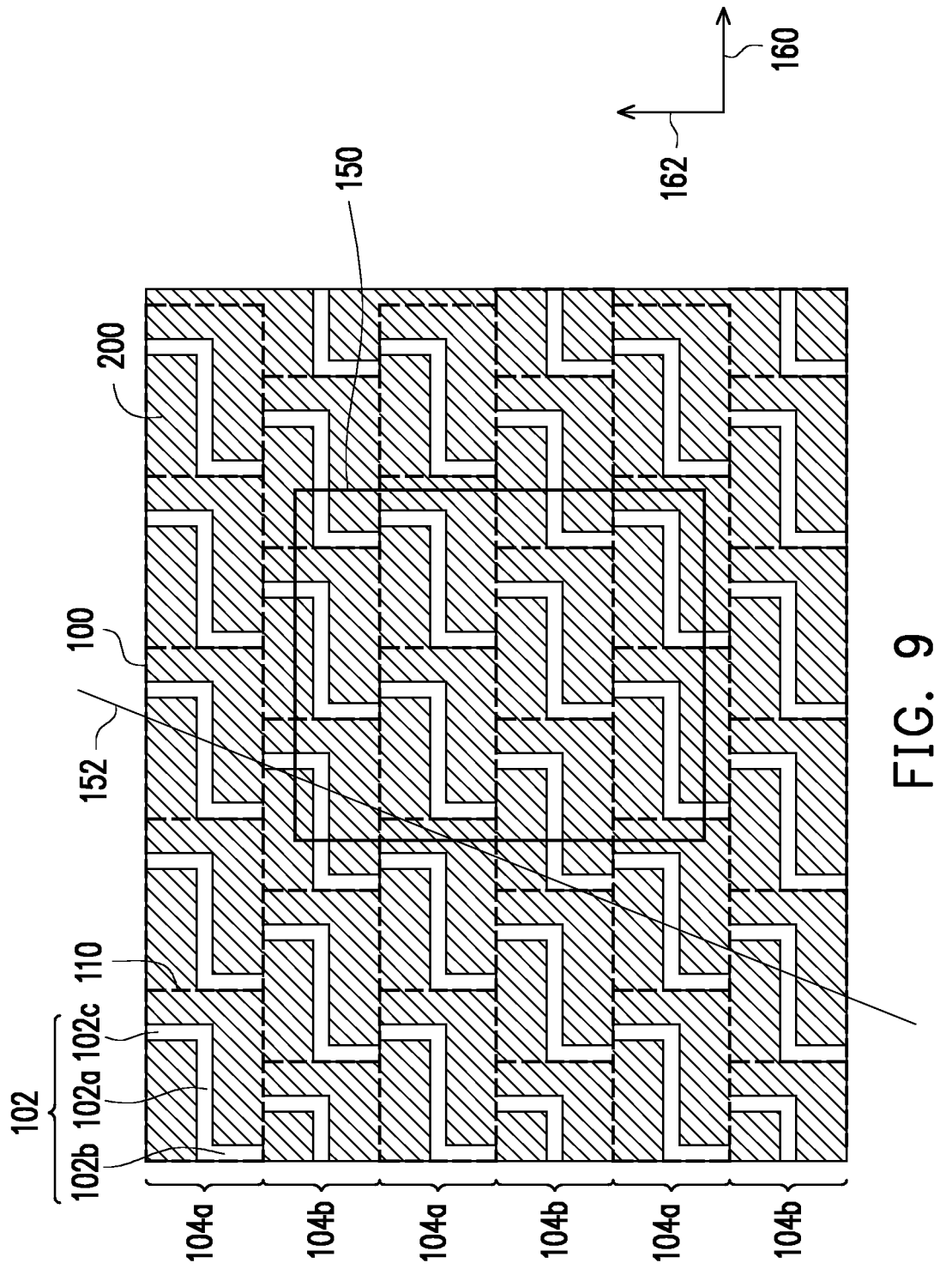
FIG. 9 to FIG. 13 are schematic diagrams of planar structures of interconnect structures according to a plurality of embodiments.

FIG. 9 to FIG. 13 are schematic diagrams of planar structures of interconnect structures according to a plurality of embodiments. Referring to FIG. 9, as for the overall semiconductor device, the interconnect structure is formed in the semiconductor device. The manufacturing of the interconnect structure is as described in FIG. 1 to FIG. 4, which requires forming a metal layer on the patterned dielectric layer, and then removing the metal on the surface of the dielectric layer via a polishing process. The remaining metal forms the interconnect structure.

In FIG. 9, the portion of the dielectric layer in a region 100 to be processed is below a metal layer 200, and protrusions 102 on the dielectric layer and the metal layer 200 are on the same plane, that is, the plane after polishing. The dielectric layer includes a plurality of protrusions 102, and the protrusions 102 are distributed in the region 100.

The metal layer 200 is disposed on the dielectric layer, and the tops of the protrusions 102 of the dielectric layer are exposed with respect to the metal layer 200. Here, for the structure of the metal layer 200, the protrusions 102 form slots of the metal layer 200. That is, the protrusions 102 form the slots of the metal layer 200 at the same time.

For the region 100 in which dishing is to be prevented, the protrusions 102 are arranged so that any straight path 152 crossing a central region 150 of the region 100 is intersected with a portion of the protrusions 102. Here, the central region 150 is defined with respect to the region 100. In other words, if the straight path 152 is in the corner of the region 100, such as four corners, the straight path 152 may not come in contact with the protrusions 102, but whenever the straight path 152 crosses the region 100, the protrusions 102 are present for blocking. As a result, the dishing path 62 exemplified in FIG. 6 to FIG. 8 is not formed. In this way, the ratio of the definition of the central region 150 to the entire region 100 may be in the range of 60% to 95%, but is not limited to this range.

The plurality of protrusions 102 are, for example, a plurality of rows 104*a* and 104*b* regularly distributed in one direction 160. One protrusion 102 may also be regarded as one structural unit 110. The protrusions 102 in two adjacent rows 104*a* and 104*b* of these rows are mutually shifted in the direction 160.

In an embodiment, each of the protrusions 102 includes a straight bar 102*a* extended in the direction 160. An extension bar 102*b* is at a side of the straight bar 102*a* and another extension bar 102*c* is at another side of the straight bar. The extension bar 102*b* and the extension bar 102*c* are extended in directions 162 opposite to each other and intersected with the direction 160, for example. For another example, the extension bar 102*b* and the extension bar 102*c* are the two ends of the straight bar 102*a*. In this way, the straight bar 102*a* and the two extension bars 102*b* and 102*c* form one protrusion 102. The two directions 160 and 162 are intersected, such as perpendicularly intersected.

To enable the straight path 152 to cross the protrusions 102 and eliminate the design of the dishing path, these protrusions 102 may be designed in other different ways under the same principle.

In an embodiment, the linewidth of the protrusions 102, that is, the widths of the straight bar 102*a* and the extension bars 102*b* and 102*c*, may be adjusted.

Figure 10:
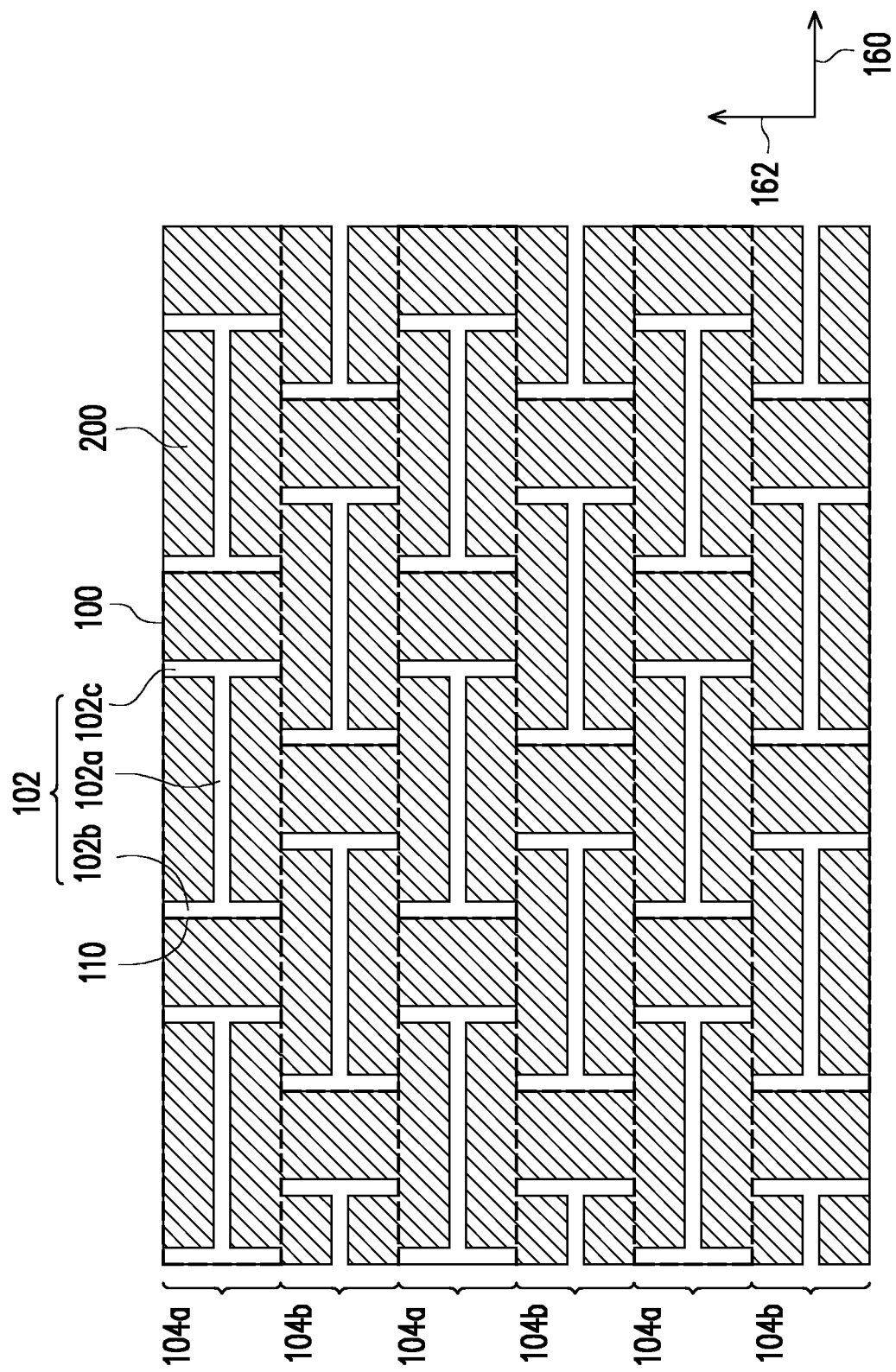

Referring to FIG. 10, an embodiment of the protrusions 102 includes, for example, the straight bar 102*a* extended in the direction 160. The extension bar 102*b* is at an end of the straight bar 102*a*. Another extension bar 102*c* is at another end of the straight bar 102*a*. In the present embodiment, the extension bar 102*b* and the extension bar 102*c* are extended in the direction 162.

The arrangement of the extension bar 102*b* and the extension bar 102*c* of FIG. 9 and FIG. 10 has a function of being extended laterally with respect to the straight bar 102*a*, thus effectively blocking the dishing path in a 360-degree direction. The positions of the extension bar 102*b* and the extension bar 102*c* may be adjusted differently according to actual needs. The invention is not limited to the illustrated embodiments.

Figure 11:
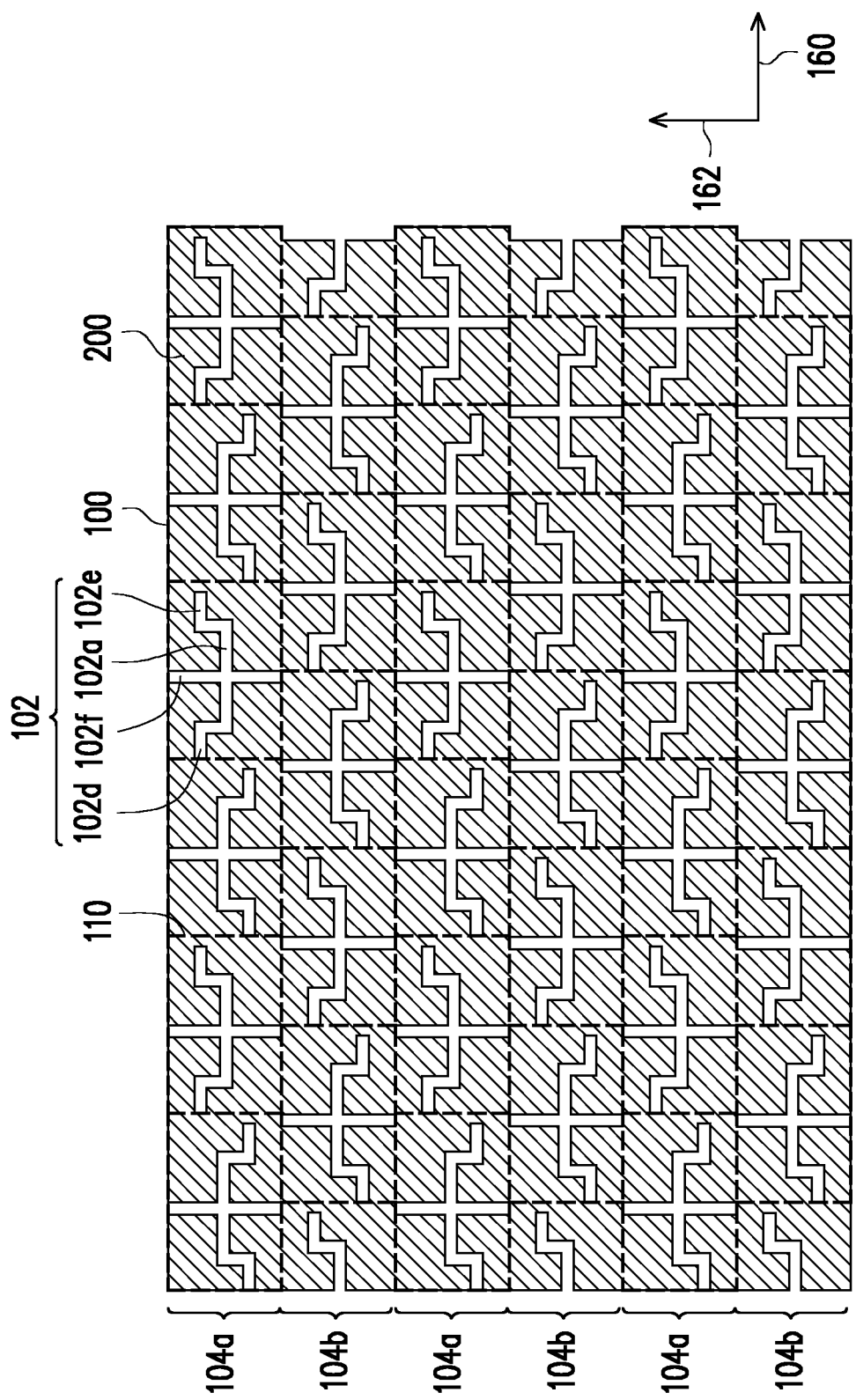

In an embodiment, referring to FIG. 11, the protrusions 102 may include the straight bar 102*a* in the direction 160 and another straight bar 102*f* in the direction 162. The straight bar 102*a* and the straight bar 102*f* thus form a cross-shaped structure. In an embodiment, the two ends of the straight bar 102*a* may be additionally provided with bent structures 102*d* and 102*e* that are, for example, right-angled bent structures. In an embodiment, the extension directions of the bent structures 102*d* and 102*e* are, for example, in the same direction 162, but for the plurality of protrusions 102 in a row 104*a* or 104*b*, the bent structures 102*d* and 102*e* thereof are alternately arranged left and right with respect to the straight bar 102*a*. In this way, there are protrusions 102 forming a barrier for each polishing direction.

Figure 12:
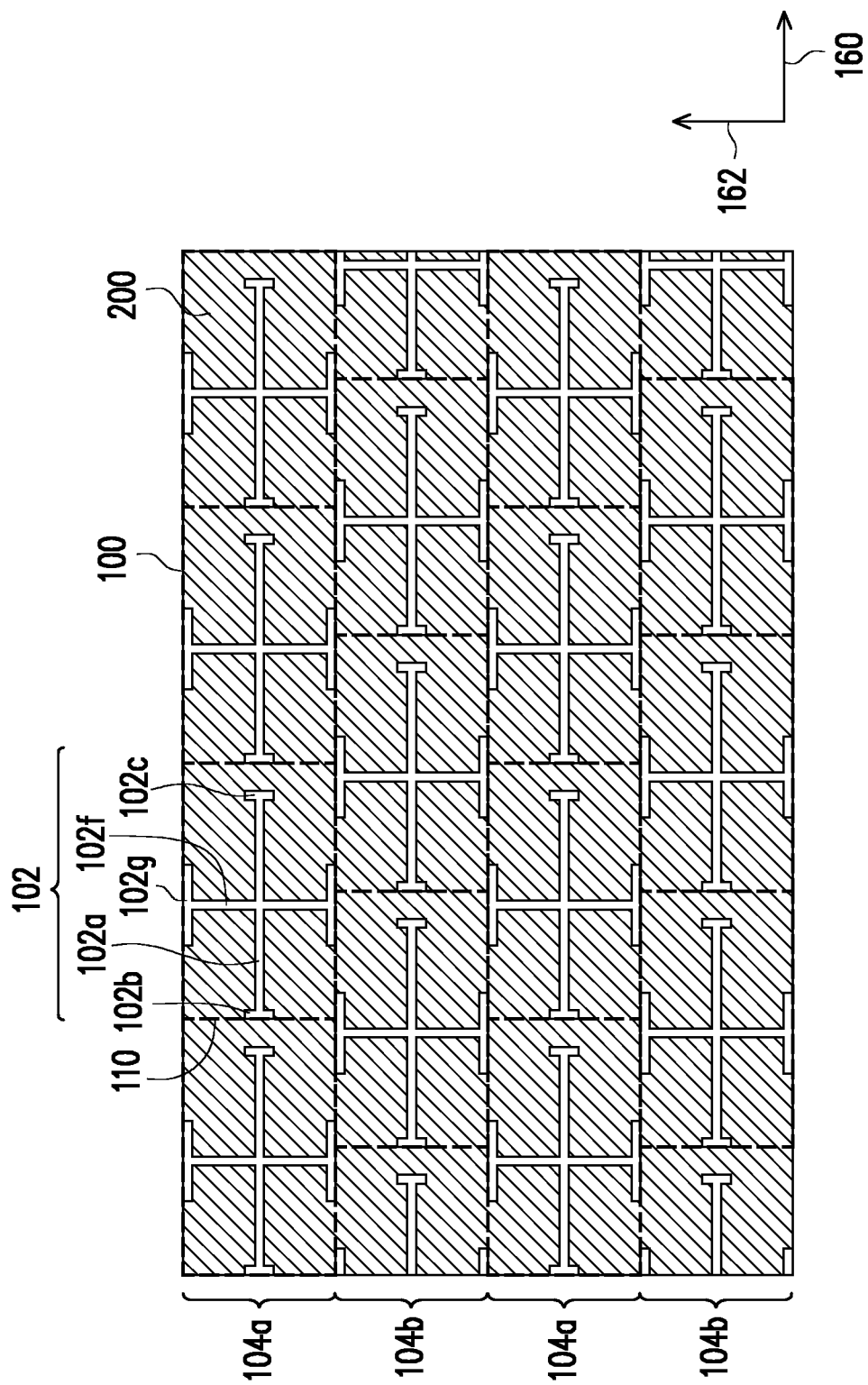

Referring to FIG. 12, in combination with the protrusions 102 of FIG. 10 and FIG. 11, the protrusions 102 of the present embodiment may include two straight bars 102*a* and 102*f* in two directions. The two extension bars 102*b* and 102*c* are respectively disposed at two ends of the straight bar 102*a*. Two extension bars 102*g* and 102*h* are respectively disposed at two ends of the straight bar 102*f*.

Figure 13:
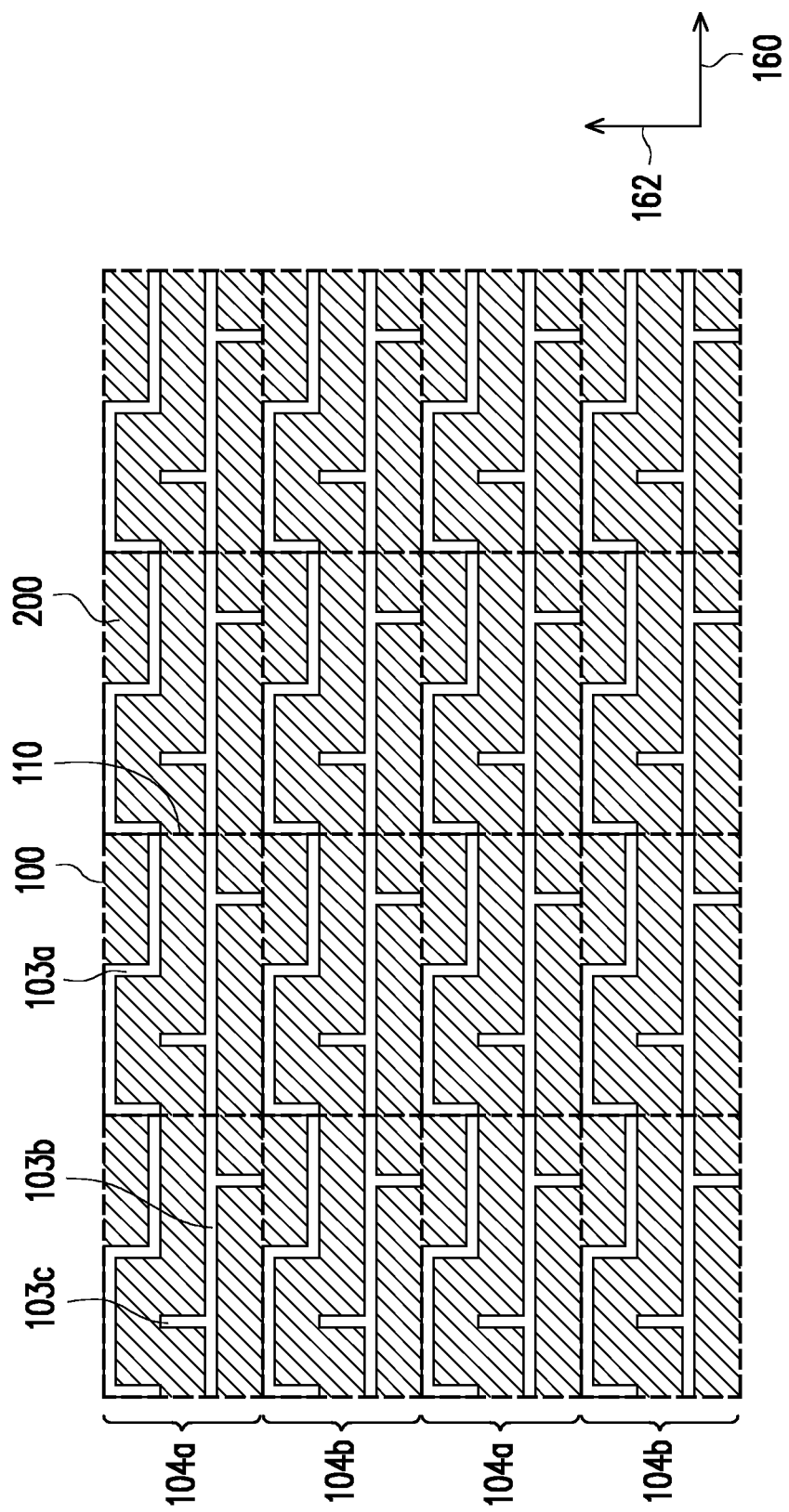

Referring to FIG. 13, in an embodiment, the protrusions 102 may also be combined with the protrusions 60 of FIG. 5 to be modified into elongated protrusions 103*a* and 103*b* alternately arranged. The shape of the protrusions 103a is, for example, a bent strip structure in the extension direction 160, wherein the bent shape of the bent strip is a pulse signal shape. The protrusions 103b are, for example, in the shape of a straight bar also extended in the direction 160 and adjacent to the protrusions 103a. The protrusions 103b also include a plurality of extension bars 103c. The left side and the right side of the straight bars are perpendicular to the direction 160, and are alternately arranged corresponding to the concave folding regions of the bent strips.

The invention provides a plurality of embodiments of the protrusions on the electrical connection layer, but the invention is not limited to the embodiments mentioned, and the embodiments may also be suitably combined with each other.

As also described above, the protrusions are a portion of the dielectric layer for forming the interconnect structure after the polishing process. However, from the perspective of the metal layer of the interconnect structure, the protrusions are exposed during the polishing process, so the protrusions form slots at the metal layer. Therefore, the shape of the slots is the same as the shape of the protrusions. The shape of the slots is the same as the previous protrusions, and the geometric structure of the slots is not repeated herein.

The protrusions of the dielectric layer of the invention may effectively reduce the dishing phenomenon caused by the polishing process for a large-area metal layer, wherein the dishing path may be effectively interrupted by the protrusions. In terms of the structure of the metal layer, the protrusions of the dielectric layer form corresponding slots at the metal layer.

Lastly, it should be noted that the above embodiments are only used to describe the technical solution of the invention instead of limiting it. Although the invention has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the invention.

What is claimed is:

1. An interconnect structure formed on a substrate in a semiconductor device, comprising:
a dielectric layer disposed over the substrate, wherein the dielectric layer comprises a region and a plurality of protrusions; and
a metal layer disposed on the region and between the plurality of protrusions, wherein tops of the plurality of protrusions are exposed with respect to the metal layer, and in a top view of the semiconductor device, the plurality of protrusions are distributed in the region,
wherein in a top view of the semiconductor device, any straight path crossing through a central region of the region is always intersected with a portion of the plurality of protrusions, and
wherein in the top view of the semiconductor device, the plurality of protrusions comprise:
a plurality of bent strips extended in a direction, wherein a bent shape of each of the bent strips is a pulse signal shape;
a continuous line created by a plurality of straight bars extended in the direction and arranged with the plurality of bent strips alternately in a second direction orthogonal to the direction; and
a plurality of extension bars, each extension bar being disposed in the second direction at an end of a corresponding straight bar and/or shared by two adjacent straight bars, where extension bars alternating with each other by being directed to one of two lines of plurality of bent strips disposed at two sides, in the second direction, from a line with the plurality of straight bars that comprises respective extension bars.

2. The interconnect structure of claim 1, wherein the region consists of rows of sub-regions extending in the direction and directly contiguous with each other, each row comprises one of the bent strips and one of the straight bars.

3. The interconnect structure of claim 2, wherein each of the bent strips is in direct contact with an edge of the row in which the bent strip is disposed.

4. The interconnect structure of claim 2, wherein the plurality of extension bars at each side are in direct contact with an edge of the row in which the straight bar is disposed.

5. The interconnect structure of claim 1, wherein the plurality of extension bars at the left side of the straight bars are aligned with each other in the second direction.

6. The interconnect structure of claim 1, wherein the plurality of extension bars at the right side of the straight bars are aligned with each other in the second direction.

* * * * *